US 6,750,722 B2

(12) United States Patent
Newman et al.

(10) Patent No.: US 6,750,722 B2
(45) Date of Patent: Jun. 15, 2004

(54) BIAS CONTROL FOR HBT POWER AMPLIFIERS

(75) Inventors: David A. Newman, Tempe, AZ (US); Benjamin R. Gilsdorf, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 40 days.

(21) Appl. No.: 10/184,857

(22) Filed: Jun. 28, 2002

(65) Prior Publication Data
US 2004/0000953 A1 Jan. 1, 2004

(51) Int. Cl.[7] .............................. H03F 3/04; H03F 3/14; H03G 3/10
(52) U.S. Cl. ...................... 330/296; 330/307; 330/285
(58) Field of Search ................................. 330/296, 307, 330/285

(56) References Cited

U.S. PATENT DOCUMENTS

| 5,216,381 A | * | 6/1993 | Botti et al. ................. 330/253 |
| 6,043,714 A | * | 3/2000 | Yamamoto et al. ......... 330/296 |
| 6,429,746 B1 | * | 8/2002 | Koukkari .................... 330/296 |
| 6,617,928 B2 | * | 9/2003 | Finlay et al. ............... 330/288 |

* cited by examiner

Primary Examiner—Patricia Nguyen

(57) ABSTRACT

A power amplifier's base current is biased by a control circuit that produces a linear relationship across varying temperatures and processes. A voltage to current converter controls a voltage follower configured operational amplifier in response to a reference device to drive the voltage and current of the power amplifier.

11 Claims, 1 Drawing Sheet

-PRIOR ART-

-PRIOR ARTus 6,750,722 B2

BIAS CONTROL FOR HBT POWER AMPLIFIERS

FIELD OF THE INVENTION

This invention relates to power amplifiers and, more specifically, to a circuit and method for controlling the bias of a hetero-junction bipolar transistor (HBT) power amplifier.

BACKGROUND OF THE INVENTION

Hetero-junction bipolar transistor (HBT) power amplifiers are becoming the standard for cellular applications due to their high power density and reduction in die size. Unfortunately, biasing these transistors with a constant current poses some difficulty. The voltage supply limitation typical to mobile applications combined with a relatively high Vbe of HBT devices make traditional integrated methods unusable.

FIG. 1 shows a typical diode based biasing control of an HBT transistor. A power amplifier Qpa HBT 100 is biased by a diode configured transistor 110 where the base and collector are shorted together and receive a current through a resistor 120 and supply voltage Vref 130. This configuration requires that a separate voltage Vref 130 (different from the battery voltage Vbat 140 supplied to the collector of the power amplifier 110) be applied to the diode transistor and the biased base of the power amplifier in order to tightly control the biasing current. This configuration leads to several problems for power amplifier applications in mobile communications. Typically, the power amplifier 100 is N times larger than the diode transistor 110 leading to current stealing. Additionally, Rref 120 needs to be large to provide stability over variations in temperature and process, but needs to be small to provide enough current to properly bias the power amplifier, resulting in a circuit that would require a stable reference which supplies a prohibitively large amount of current and is not a viable circuit for power amplifiers in mobile communications applications.

Another solution, shown in FIG. 2, solves the problem of current stealing by using a current mirror with an emitter follower to bias the current supplied to the power amplifier's base. The base of a power amplifier transistor 200 is connected to a base of mirrored transistor 210 and the emitter of a emitter follower transistor 250. The collector of the mirrored transistor 210 is connected to the base of the emitter follower transistor 250 and is connected to a reference voltage 230 through a reference resistor 220 while the collector of the emitter follower transistor 250 is connected to the battery voltage 240 which is also connected to the collector of the power amplifier transistor 200 through some impedance 270. However, this type of circuit is not viable because gallium arsenide (GAS) HBT power amplifiers as now used have Vbe's in the order of 1.4 volts while battery voltage supplies are required to be in the range of 2.7 volts. To control the voltage at the base of the power amplifier, the voltage supply, Vref 230, would need to be greater than is desirable for mobile communication applications and the solution is therefore not viable.

What is needed is a method of controlling the bias of an HBT power amplifier transistor used in RF applications that provides stability over temperature and process.

DETAILED DESCRIPTION OF THE PREFERRED EMBODIMENT

Figure 1:
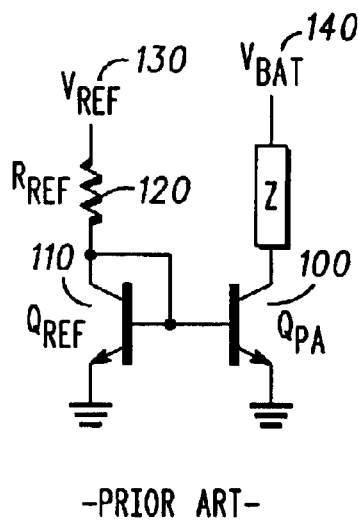
FIG. 1 is a simplified electrical schematic of a prior art HBT diode based biasing circuit.
Figure 2:
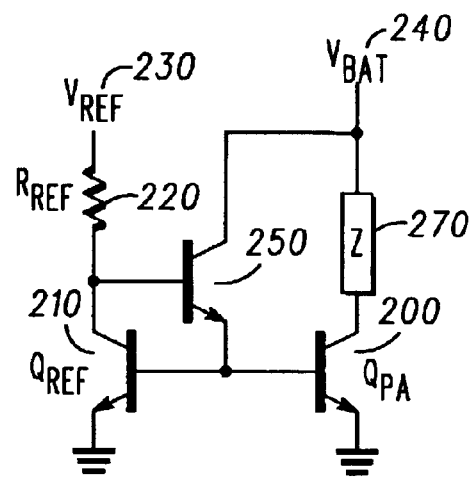
FIG. 2 is a simplified electrical schematic of another prior art HBT biasing circuit.
Figure 3:
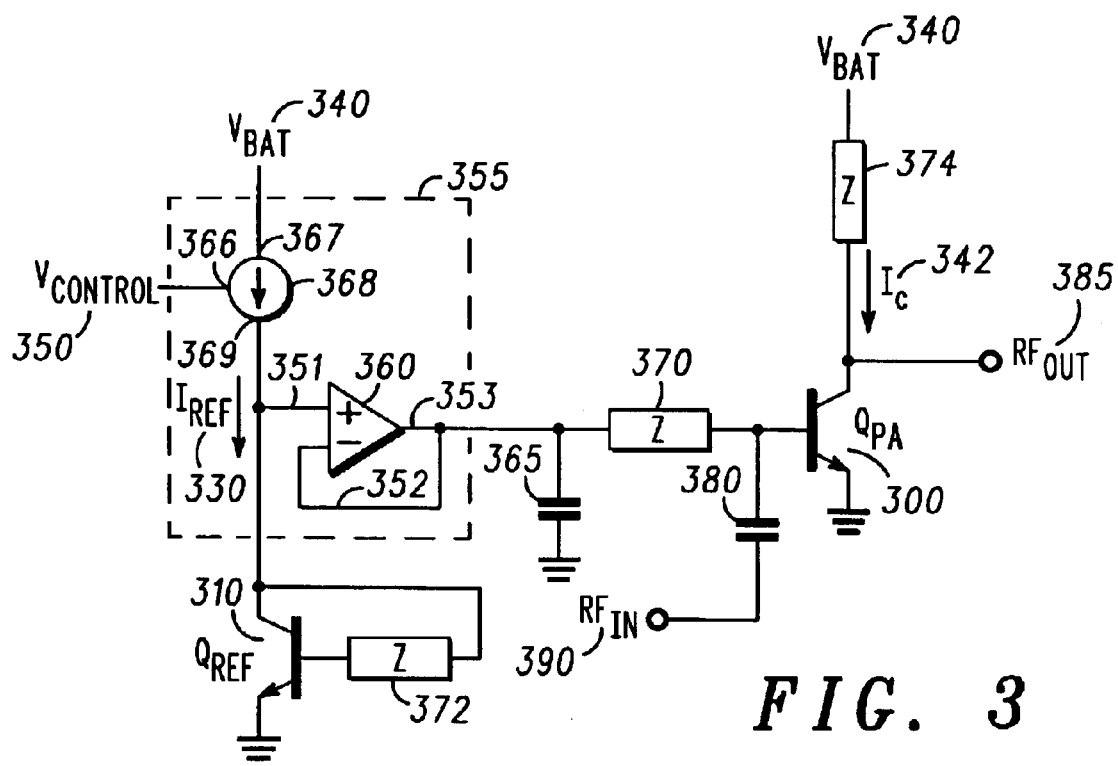
FIG. 3 is a simplified electrical schematic of an HBT power amplifier bias controller according to an embodiment of the invention.

Referring to FIG. 3, one model of an embodiment of a bias control for a hetero-junction bipolar transistor (HBT) power amplifier is shown. Though the circuit was designed for HBT technology, it is not limited to this technology and could be used in technologies such as EMODE. Similar reference numerals are used throughout the figures to represent similar features when possible.

An HBT power amplifier 300 is biased based on the voltage measured on reference HBT transistor 310 by way of a CMOS chip 355. Although the depiction shows the reference device and PA device to be an HBT transistor, other reference devices and PA devices are contemplated.

The collector of the HBT power amplifier 300 is tapped for an RF output 385 and is supplied voltage from a battery source 340 and some impedance 374 while the emitter is connected to ground. The base of the HBT power amplifier 300 is connected through some impedance 370 to a first input 352 of the operational amplifier 360. The connection of the first input 352 is coupled to ground through a capacitor 365. Additionally, an RF input signal 390 is injected into the base of the HBT power amplifier 300 through some capacitor 380. Although the RF input and output signals are shown, they are not necessary to the discussion of the operation of the bias control of the power amplifier and are shown only for completeness.

The output 353 of the operational amplifier is fed back and connected to the first input 352 of the operational amplifier in order to cause the operational amplifier to function as a voltage follower where the voltage appearing on a second input 351 of the operational amplifier 360 appears some minimal time later on the output 353 of the operational amplifier 360. The second input 351 of the operational amplifier 360 is connected to an output of a voltage-to-current converter 368 as well as to the base through some impedance 372 and to the collector of the reference device 310, in this case another HBT transistor. A control 366 of the voltage-to-current converter is connected to a voltage control signal 350 and the battery supply 340 is used to supply voltage to the voltage-to-current converter 368 through another input 367.

In operation, the present invention uses an external CMOS chip and bias control 355, consisting of an operational amplifier 360 and a voltage-to-current converter 368 to bias the HBT power amplifier 300. An analog voltage, Vcontrol 350, adjusts the reference current, Iref 330, through the reference device 310. The Vbe of this reference devices is measured by the operational amplifier 360 and applied to the base of the HBT power amplifier 300. The HBT power amplifier's collector current Ic 342 reflects the reference current Iref 330 times the ratio of the size difference between the power amplifier 300 and the reference device 310.

This configuration of biasing an HBT power amplifier transistor maintains several advantages over traditional methods. The voltage requirements are only 1 Vbe plus the overhead of the current source that typically is only a few hundred millivolts. Also, current through the reference device 310 is significantly less temperature dependent due to the high output impedance of the current source compared a resistor. Additionally, the reference device 310 can be sourced from the normal battery source operating the power amplifier rather than having to create an independent stable reference. Other advantages are that Iref is not a function of the battery voltage or of process leading to more stabilized control and linearity of the bias control. Additionally, the control voltage Vcontrol can operate the bias as low as Vcontrol=0 volts.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An integrated circuit comprising:
   a power amplifier having a base; an emitter and a collector;
   a bias control circuit controlling a current supplied to the base of the power amplifier; and
   a reference device having a base, a collector and an emitter wherein the base of the reference device is isolated from the base of the power amplifier; wherein,
   the bias control circuit comprises an operational amplifier having a first input, a second input and an output and a voltage to current converter having a source input, a control input and an output; and
   the first input of the operational amplifier is connected with the base of the reference device, to the output of the voltage to current converter and to the collector of the reference device, the second input of the operational amplifier is connected to the output of the operational amplifier and with the base of the power amplifier.

2. The integrated circuit of claim 1, wherein the power amplifier and the reference device are gallium arsenide (GAS) hetero-junction bipolar (HBT) transistors.

3. The integrated circuit of claim 2, wherein the power amplifier is N times greater in size than the reference device.

4. The integrated circuit of claim 1 wherein the voltage to current converter and the collector of the power amplifier are both driven by a common battery source.

5. The integrated circuit of claim 1 wherein the operational amplifier is configured as a voltage follower.

6. The integrated circuit of claim 4 wherein the operational amplifier is configured as a voltage follower.

7. The integrated circuit of claim 1 wherein the source input and the collector of the power amplifier are connected to a common battery source and the emitters of the power amplifier and reference device are connected with ground.

8. The integrated circuit of claim 7 wherein an RF signal is injected into the base of the power amplifier and an amplified RF signal is produced at the collector of the power amplifier.

9. An integrated circuit comprising:
   a power amplifier having a collector producing an output signal and connected with a battery source, an emitter connected with ground and a base injected by an RF signal and connected with a first input and an output of an operational amplifier;
   a reference device having a collector connected to a second input of the operational amplifier, a base connected with the collector and an emitter connected with ground; and
   a voltage to current converter having a power source input connected with the battery source, a control input connected with an analog control signal and an output connected to the second input of the operational amplifier and to the collector of the reference device.

10. The integrated circuit of claim 9 wherein the power amplifier and the reference device are GAS HBT transistors.

11. The integrated circuit of claim 10 wherein the power amplifier is N times greater in size than the reference device.

* * * * *